United States Patent [19]

Yonehara et al.

[11] Patent Number: 5,457,317
[45] Date of Patent: Oct. 10, 1995

[54] ELECTRON MICROSCOPE, A CAMERA FOR SUCH AN ELECTRON MICROSCOPE, AND A METHOD OF OPERATING SUCH AN ELECTRON MICROSCOPE

[75] Inventors: Katsuhisa Yonehara, Katsuta; Teiji Katsuta, Mito; Isao Matsui, Katsuta, all of Japan

[73] Assignee: Hitachi, Ltd., Tokyo, Japan

[21] Appl. No.: 121,897

[22] Filed: Sep. 16, 1993

[30] Foreign Application Priority Data

Sep. 17, 1992 [JP] Japan .................. 4-247544

[51] Int. Cl.⁶ .................................................. G01N 23/00
[52] U.S. Cl. ................... 250/311; 250/483.1; 250/486.1
[58] Field of Search ........................... 250/311, 397, 250/483.1, 486.1, 487.1, 366

[56] References Cited

U.S. PATENT DOCUMENTS

| | | | |
|---|---|---|---|
| 3,048,698 | 3/1959 | Carlson | 250/486.1 |
| 3,671,742 | 6/1972 | Browning | 250/311 |
| 3,849,647 | 11/1974 | Koike et al. | 250/311 |
| 3,868,510 | 2/1975 | Murata et al. | 250/366 |
| 3,944,817 | 3/1976 | Hilsum et al. | 250/213 VT |
| 4,399,360 | 8/1983 | Fotino | 250/311 |
| 4,694,177 | 9/1987 | Akai | 250/366 |
| 5,015,057 | 5/1991 | Rumbaugh et al. | 350/96.15 |
| 5,153,926 | 10/1992 | Jansson et al. | 378/87 |

FOREIGN PATENT DOCUMENTS

| | | |
|---|---|---|
| 379865 | 1/1990 | European Pat. Off. . |
| 56-16068 | of 1981 | Japan . |
| 58-37658 | 3/1983 | Japan . |
| 61-225739 | 10/1986 | Japan . |
| 2183898 | 6/1987 | United Kingdom . |

*Primary Examiner*—Jack I. Berman
*Assistant Examiner*—James Beyer
*Attorney, Agent, or Firm*—Antonelli, Terry, Stout & Kraus

[57] ABSTRACT

An electron microscope uses a camera with a plurality of fluorescent elements separated by walls and a corresponding plurality of detector elements which receive light from fluorescent elements. The walls prevent electrons incident on one fluorescent element from affecting an adjacent fluorescent element, thereby reducing blurring of the image produced by the camera. The fluorescent elements may be connected to the detector elements by waveguides having filters which permit the intensity of light transmitted to each detector element to be adjusted to give a uniform response. The fluorescent elements may be arranged in a linear array, and the electron microscope is then operated to cause an image of a sample to scan across the array.

20 Claims, 9 Drawing Sheets

ELECTRON MICROSCOPE, A CAMERA FOR SUCH AN ELECTRON MICROSCOPE, AND A METHOD OF OPERATING SUCH AN ELECTRON MICROSCOPE

BACKGROUND OF THE INVENTION

Field of the Invention

The present invention relates to an electron microscope, and in particular to a transmission electron microscope in which an electron beam is incident on a sample and passes therethrough for subsequent detection. The present invention also relates to a camera for use in such an electron microscope, and to a method of operating such an electron microscope.

SUMMARY OF THE PRIOR ART

It is known to observe and record an electron beam image in a transmission electron microscope by utilizing a fluorescent screen in an observation chamber and photographing the image thereof on a film. Films loaded in a film cartridge in a camera chamber in a vacuum state are exposed one by one as required, then are put into a film receiving box after each exposure. Development of exposed films is carried out by first breaking the vacuum of the camera chamber, then removing the film receiving box from the camera chamber and finally processing the film in a dark room to develop it. Such processing includes e.g. development, fixing, rinsing and drying. Also because the various chemicals needed in these processes are acid-alkali solvents, an environmental problem arises. Furthermore, because a large quantity of poisonous substances such as halogenated silver are contained in the waste liquid, a safety problem relating to the waste liquid disposal arises.

Figure 1A:
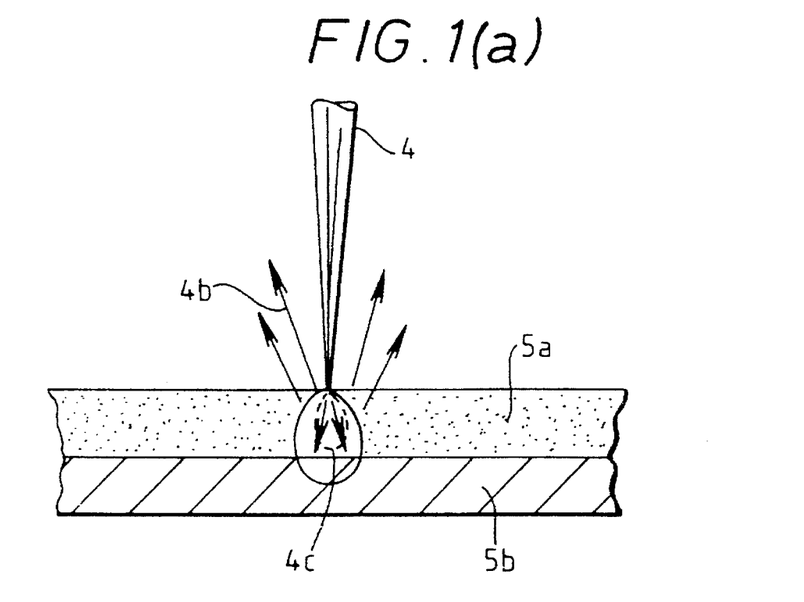
FIGS. 1(a) and 1(b) illustrate the effect of an electron beam on a fluorescent screen, FIG. 1(a) showing the scattering of electrons from the point of incidence of the beam, and FIG. 1(b) illustrating the effect of blurring resulting, FIG. 1(a) and 1(b) having already been described.

Referring now to FIG. 1(a) of the accompanying drawings, the effect of an electron beam on a fluorescent screen is illustrated. The fluorescent screen comprises a fluorescent layer 5a which has been deposited on an aluminum plate 5b. When the electron beam 4 is incident on the fluorescent layer 5a, electrons 4b may be scattered from the point of incidence and, may penetrate a region 4c surrounding the point of incidence. Then, light will be generated from the whole of region 4c, thereby resulting in blurring.

Figure 1B:
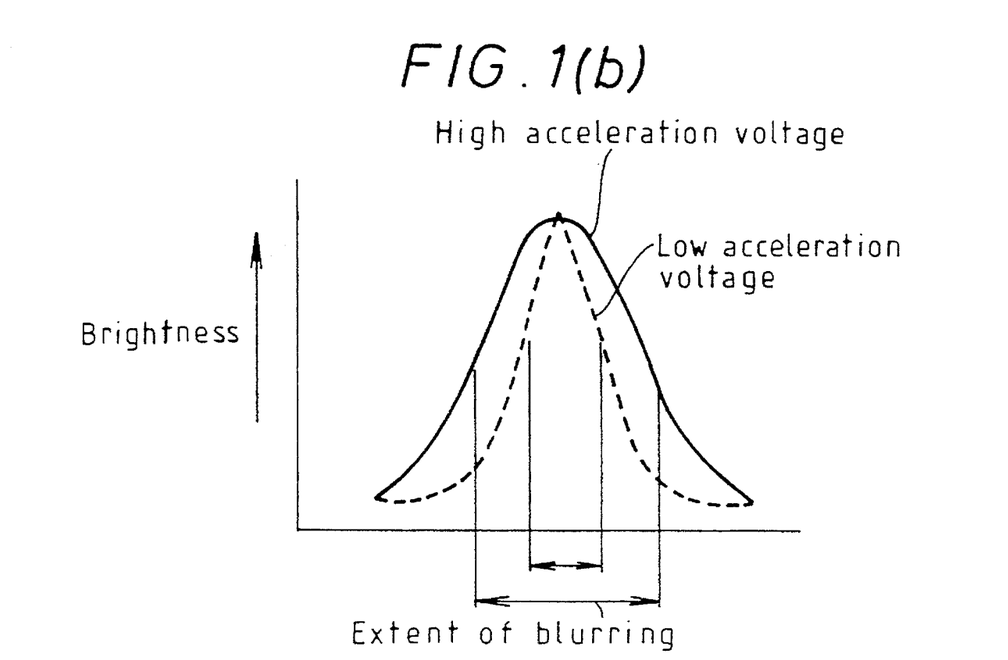

The effect of this blurring is shown in FIG. 1b of the accompany drawings. It can be seen from FIG. 1(b) that the extent of the blurring (i.e. the extent of region 4c in FIG. 1(a)) is determined by the acceleration voltage of the electron beam. As the acceleration voltage increases, the extent of the blurring also increases. Thus, the resolution of the electron microscope decreases as the energy of the electron beam increases. The radius of region 4c in FIG. 1(a) is approximately 50 μm when the acceleration voltage is 100 kV and is approximately 550 μm when the acceleration voltage is 500 kV.

In order to prevent, or at least reduce, such blurring, it is known to modify the fluorescent screen so that the fluorescent layer 5a in FIG. 1(a) comprises a plurality of separated pixels. The separation of those pixels by suitable walls limits the spread of electrons 4b, so that the electrons 4b are confined within a pixel. An example of such a disclosure is shown in JP-A-56-37658. As an alternative, JP-A-61-225739 proposed that the fluorescent layer 5a had a regularly stepped configuration so that electrons scattered from one stepped region did not significantly affect the adjacent regions. JP Utility Patent Laid-Open No. 56-16068 disclosed an arrangement in which detected light from the fluorescent substance is directed to a charge-coupled device through a fiber plate.

SUMMARY OF THE PRESENT INVENTION

The present invention seeks to make use of a camera which generates signals more directly. Therefore, at its most general, the present invention proposes that a camera is used with fluorescent elements, with walls therebetween, and a plurality of detector elements for detecting light generated by respective ones of the plurality of fluorescent elements. The walls between the fluorescent elements prevent or reduce blurring of the image, as described with reference to FIGS. 1(a) and 1(b), but the detector elements then permit detection signals to be generated directly, without the need of photography. The detector elements may form a solid state array. Such an array may extend in two dimensions, but the manufacture of such a two-dimensional array is not easy, at least to generate an array sufficiently large for use in an electron microscope.

Therefore, in a first development of the present invention, it is proposed that the fluorescent elements form a linear array. Then, the electron beam which has passed through the sample, (hereinafter "the image beam"), may be caused to scan transversely to the linear array of fluorescent elements. As the image of the sample passes over the linear array, light will be generated from those of the plurality of fluorescent elements which receive electrons. Therefore, by analyzing the outputs of the fluorescent elements on a time-division basis, an image of the sample may be generated.

Preferably, light is directed from each of the fluorescent elements to respective ones of the detector elements via corresponding optical waveguides. This permits a further advantage to be achieved, as will now be described.

Figure 2A:
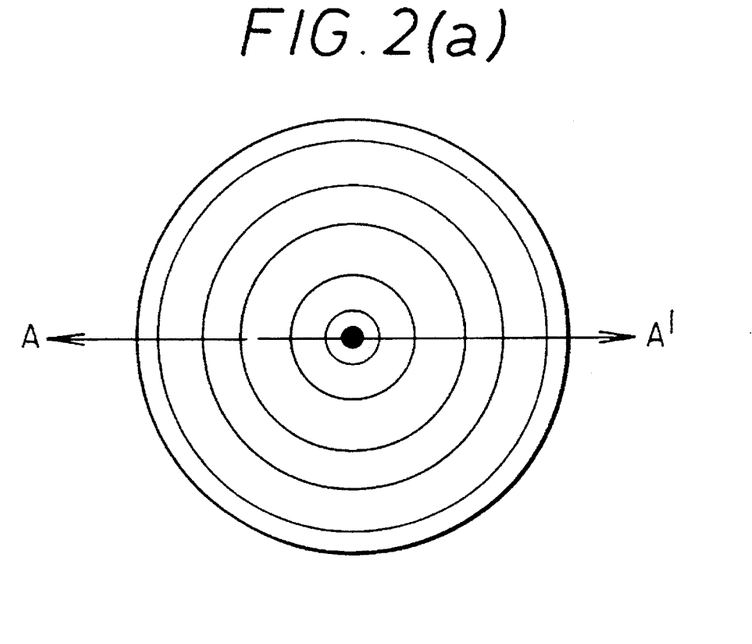
FIGS. 2(a) and 2(b) show the electron beam diffraction image of a sample, and the brightness intensity of that image, and have already been described.
Figure 2B:
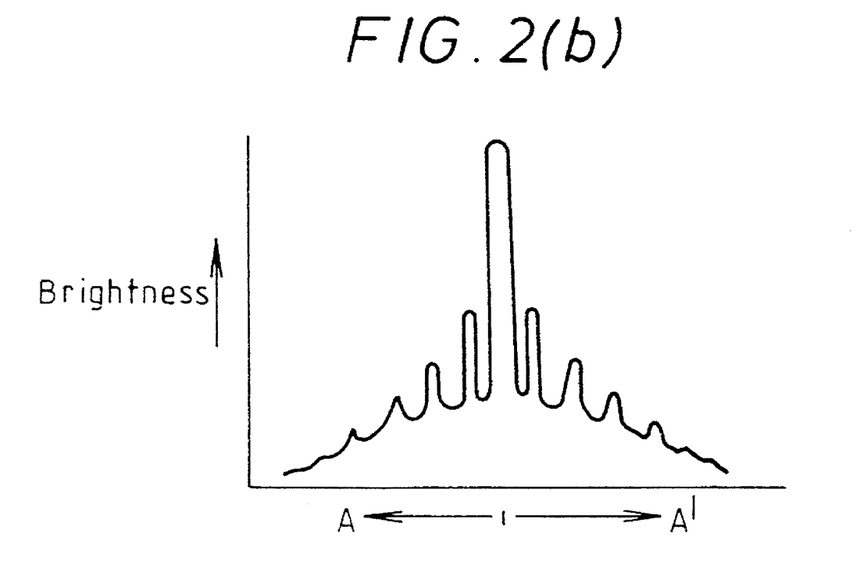

FIG. 2(a) illustrates the electron beam diffraction image of a sample. That image comprises a plurality of concentric rings. As shown in FIG. 2(b), the brightness intensity of the light generated by each ring varies, with the central spot and the adjacent rings having a brightness significantly greater than the outer rings of the image. Therefore, the outer rings cannot be observed since they are hidden by the background "noise" due to the fluorescent substance.

Therefore, it is proposed that the optical waveguides each contains an adjustable filter for controlling the amount of light transmitted thereby. Since, the filters may be controlled to reduce the amount of light permitted to reach the detector elements from those fluorescent elements corresponding to the central spot and relatively bright rings, so that a more uniform brightness is achieved at the detector elements. This permits sensitive detector elements to be used. Without such filters, sensitive elements cannot be used because they would be damaged by the light from the central spot and the bright rings.

Preferably, the filters are liquid crystal elements.

It may be noted that a camera comprising fluorescent elements and detector elements connected by optical waveguides with adjustable filters therein represents another, independent aspect of the present invention.

Although such a camera may have fluorescent elements forming a two-dimensional array, a further advantage can be achieved if the array is linear and the waveguides are curved about an axis parallel to the linear array of the fluorescent elements. Then, when such a camera is used e.g. in a electron microscope, the detectors lie clear of the plane containing the detector array and the sample. Therefore, there is a lower probability that electrons will reach the detector elements, thereby reducing the risk of damage to the detector elements by such electrons.

In an electron microscope according to the present invention, it is preferable that a mask be provided between the sample and the camera, which mask contains an opening. The mask then prevents electrons reaching the camera, except through the opening. This gives, the advantage of reducing background noise which may otherwise occur from electrons which have been scattered from other parts of the electron microscope. The opening may be closeable by a moveable shutter so that electrons reach the camera only when desired.

The present invention also relates to a method of operating an electron microscope. In another aspect of the present invention, it is proposed that the electron beam which is passed through the sample is focused and scanned transversely across a linear detector. This permits the output of the linear detector to be time-divided. In a further aspect, the amount of light passes between fluorescent elements and detector elements is controlled, thereby to adjust the brightness of light received by those detector elements. As previously described, such control may be achieved by filters in waveguides between the fluorescent elements and detector elements.

BRIEF DESCRIPTION OF THE DRAWINGS

Embodiments of the present invention will now be described in detail, by way of example, with reference to the accompanying drawings in which.

DETAILED DESCRIPTION

Figure 3:
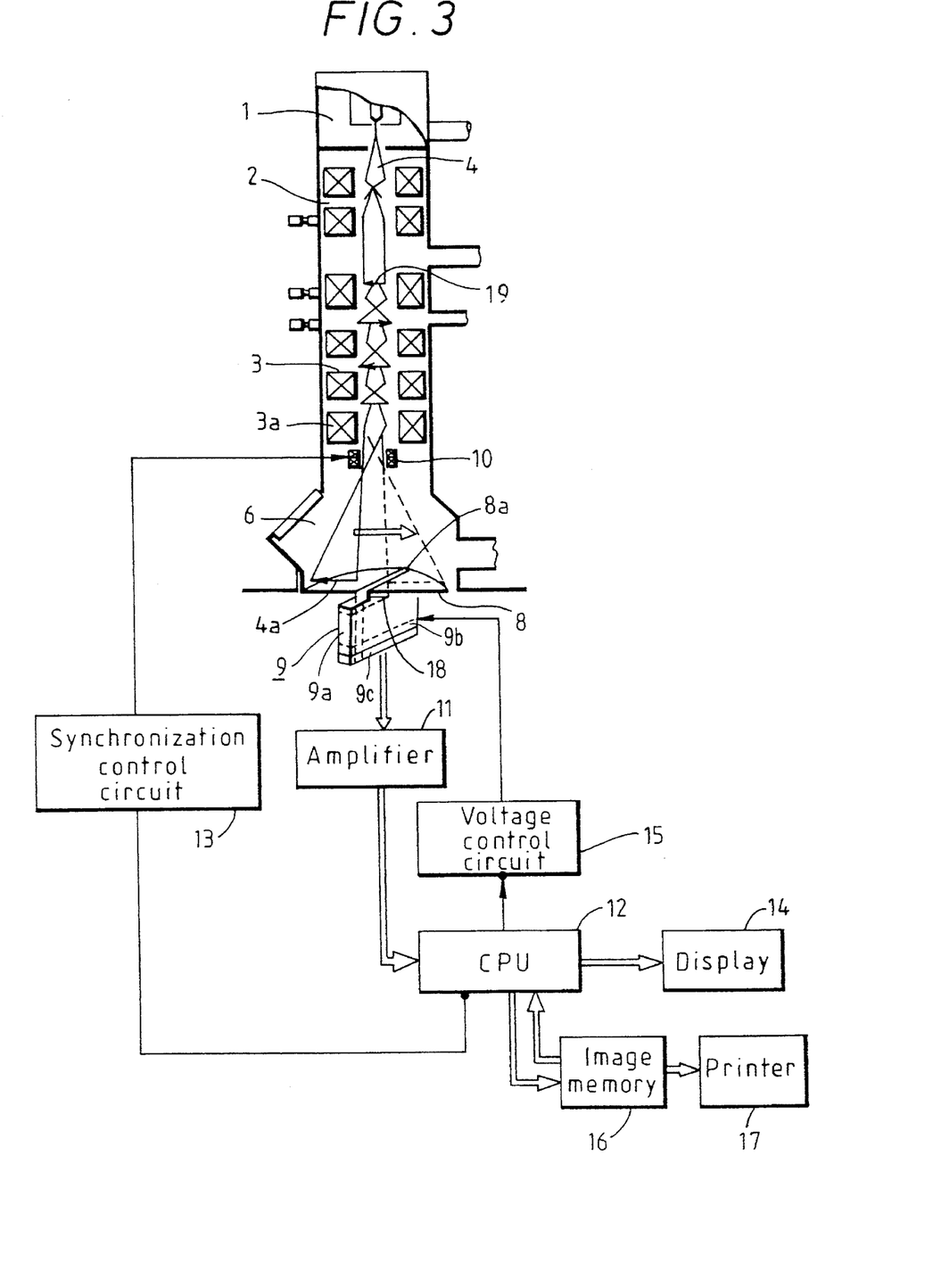
FIG. 3 shows an electron microscope being a first embodiment of the present invention.

FIG. 3 illustrates schematically an electron microscope being a first embodiment of the present invention. In FIG. 3, an electron beam 4 is emitted from an electron gun 1 and is directed onto a specimen (sample) 19 for exposure thereof by means of an illumination or condenser lens 2. An image of the specimen 19 is then formed by means of an image-forming lens 3. The electron beam image 4a obtained by a final-stage projection lens 3a is caused to scan by a deflecting coil 10, while being protected on a mask 8 which is at a position corresponding to that of a conventional fluorescent screen.

When a shutter 18 of the mask 8 is opened, a part of the electron beam image 4a which has passed through a slit 8a in the mask 8 is received by a linear camera 9. The width of the slit 8a in the mask 8 can be accurately determined and/or controlled so that adequate brightness and image information is achieved, so as to satisfy the resolution requirements of the linear camera 9.

The image projected onto the mask 8 is converted from a light signal into an electric signal in the camera 9. That electric signal is then amplified in a camera head amplifier 11. The amplified image signal is then transmitted to a processor (CPU) 12, which performs image processing and brightness control, controlling the camera 9 via a voltage control circuit 15. The data thus obtained may be monitored on a monitor (display) 14, and/or stored in an image memory 16 as required, and can be printed out by a printer 17. Synchronization between the monitor 14 and the electron beam image 4a is achieved by the deflecting coil 10, which may be either in the upper part or in the lower part of the projection lens 3a, in conjunction with a deflecting coil synchronization control circuit 13. The scanning rate of the electron beam image is controlled by means of a image processing and brightness control function of the CPU 12, and via the deflecting coil synchronizing control circuit 13.

Figure 4A:
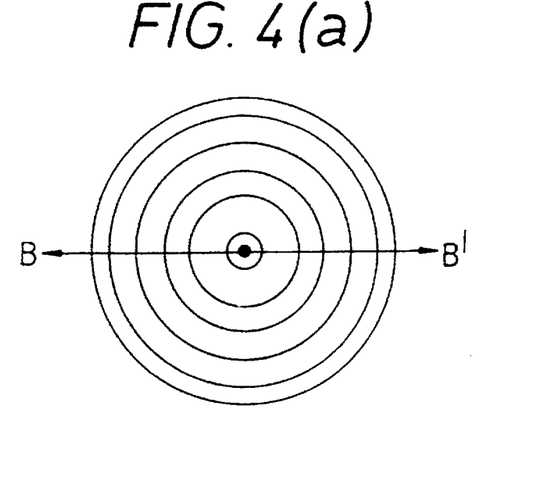
FIGS. 4(a) to 4(c) respectively, show an electron beam diffraction image, the brightness distribution of that image, and a modified brightness distribution which may be achieved by embodiments of the present invention.
Figure 4B:
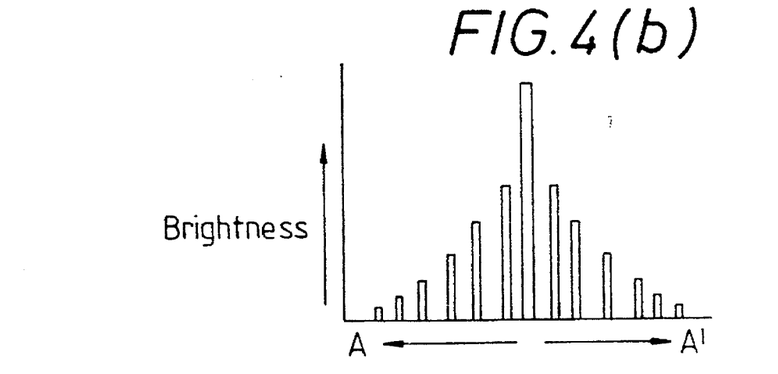
Figure 4C:
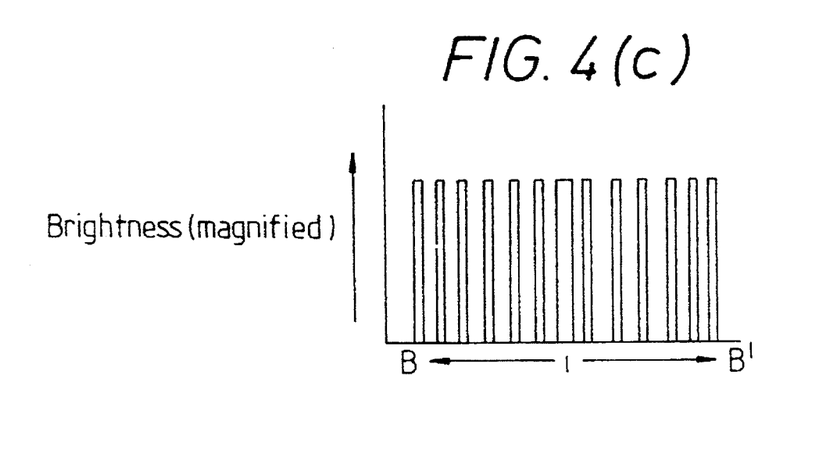

FIGS. 4(a), 4(b) and 4(c) illustrate, for an electron beam diffraction image, operational effects and advantages attained by a liquid crystal filter (whose details will be described later) installed in the camera 9.

FIG. 4(a) illustrates an example of an electron beam diffraction image obtained with a polycrystalline specimen, and is similar to FIG. 2(a). The brightness distribution obtained by scanning along a line B—B' across the electron beam diffraction image with a microphotometer is shown in FIG. 4(b). The brightness of the electron beam diffraction image, as can be seen, decreases with distance from the center of the image. Thus it becomes impossible for an electron beam diffraction image of a higher order (i.e. the outer rings in FIG. 4(a)) to be identified. If a camera was used which could detect the outer rings in FIG. 4a, it would be damaged by the high intensity of the inner rings and central slot. It can also be seen from FIG. 4(b) that when a pixel partition type linear solid-state image pick-up device camera 9 is utilized for image detection, each pixel is clearly distinguished. Thus, there is no blurring of pixels as was described with reference to FIG. 2(b).

In order to eliminate uneven brightness distribution between pixels, the brightness of each pixel is detected as a voltage. The CPU 12 executes image processing and brightness control, then through a liquid crystal voltage control circuit 15, and the amplifier 11, the brightness is adjusted using a liquid filter crystal 96 in the camera 9. The result of such adjustment (including amplification) is shown in FIG. 4(c). Thus, an averaged brightness is obtained thus enabling the parts of the electron beam image of higher orders to be identified.

Figure 5:
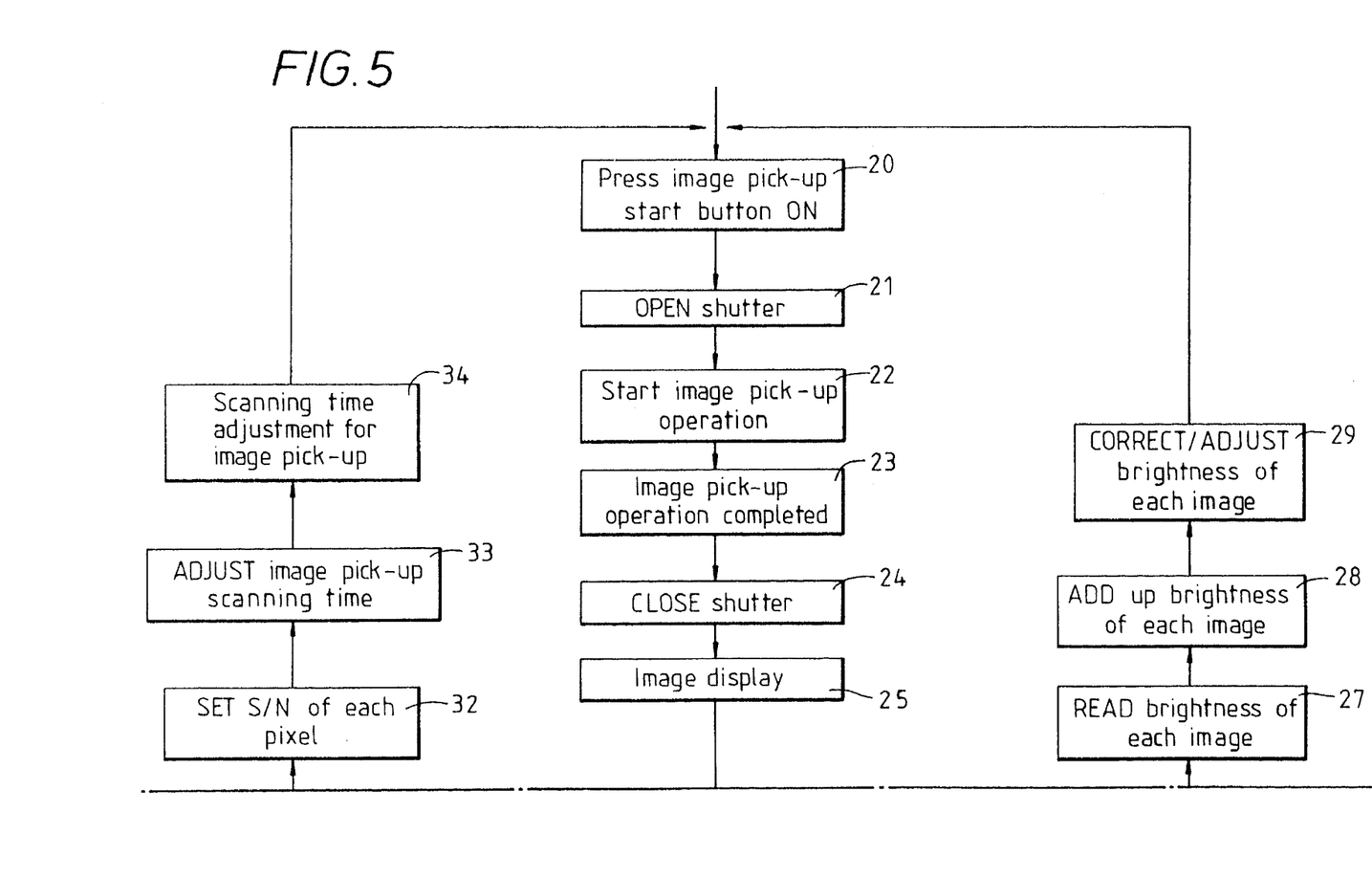
FIG. 5 is a flowchart showing a method of operating an electron microscope according to the present invention.
Figure 6A:
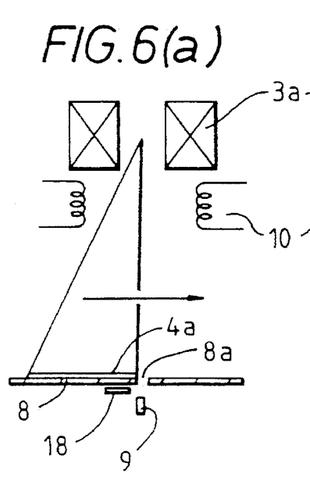
FIGS. 6(a) to 6(c) show successive stages in the scanning of an image of a sample in the electron microscope of FIG. 3.

A flowchart illustrating of the steps of observation and recording of an image under the control of the CPU 12 for image processing and brightness control is shown in FIG. 5. FIGS. 6(a),(b) and (c) show the relative positions of the mask 8, slit 8a, shutter 18, and camera 9, during the scanning time for detecting the electron beam image 4a, when the electron beam image 4a is scanned by the deflecting coil 10.

Figure 6B:
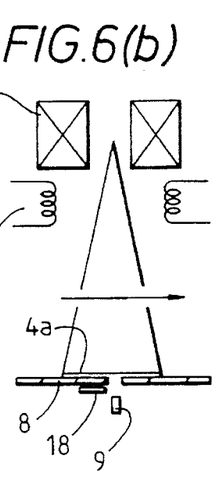

The operation of this embodiment will be described with reference to FIGS. 5 and 6. When a start button on a console panel (not shown) is pressed, the image pick-up operation starts (step 20), and the shutter 18 is opened (step 21, FIG. 6(a)). The image pick-up operation starts (step 22) and at the same time, the electron beam 4 is caused to scan transversely to the camera 9 due to the action of the deflecting coil 10 (FIG. 6(b)). After completion of the image pick-up operation (step 23, FIG. 6(c)), the shutter 18 is closed (step 24). The image obtained through such steps of operation is displayed on a monitor 14 (step 25). At the same time, the brightness of the image displayed is confirmed (step 26).

When the brightness is not uniform, the brightness of each pixel is read out (step 27), and the brightness of each pixel (step 28) is compared. A brightness correction adjustment may then be made in (step 29) by the voltage control circuit applying suitable control signals to the filter 90 of the camera 9. Steps 20 to 26 are then repeated. When a uniform brightness of image is obtained at step 26, the quality of image is estimated (step 30). When the image quality, that is, the signal-to-noise ratio (S/N ratio) is low, the S/N for each pixel is read out (step 31), and an appropriate S/N ratio for each pixel is set (step 32). The scanning time for picking up an electron beam image is corrected accordingly (step 33) and so adjusted (step 34). After that the steps 20 to 30 are repeated again.

The electron beam image thus generated is then subjected to image processing and image record identification (step 35). When the image is not yet recorded (step 36), the image processing thereof is executed (step 37). On the other hand, when the image is already stored (step 38) a check is made as to whether a call request for the image exists or not (step 39). If no request is present, the process is terminated (step 40). If any call request is present, a process for starting output display is executed (step 41).

Thus, when the image pick-up start button on the console panel is pressed, the shutter 18 opens thereby allowing the electron beam image 4a to reach the camera 9. Due to the combined effect of the deflecting coil 10, for permitting the electron beam image 4a to be scanned, the mask 8 and slit 8a, and the shutter 18, only the minimum amount of the electron beam necessary for enabling satisfactory image pick-up is allowed to enter the camera. Therefore, reduction in the light emitting efficiency of fluorescent substances used in the camera 9 due to ageing can be prevented. In addition, the service life of the luminescent substance and solid-state image pick-up devices of the camera 9 may be prolonged more than four times, as compared with known observation methods even at higher acceleration voltages.

Because observation of the image (which used to be done conventionally in a dark room) can be made in a bright room, the operational efficiency can be improved substantially. Also, because a series of complicated film development processes to be operated in a dark room is not necessary, the difficulties of ensuring safe operation, in particular when handling chemicals, and preventing environmental pollution can be solved according to the invention.

Figure 7:
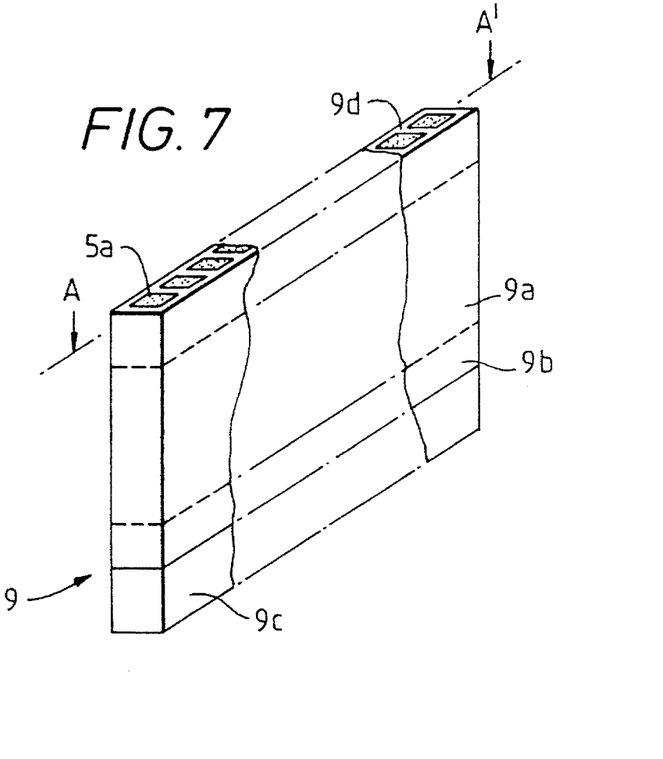
FIGS. 7 and 8 show a first embodiment of a camera for use in the electron microscope of FIG. 3, FIG. 7 being a perspective view and FIG. 8 being a sectional view along the line A to A 1 in FIG. 7.
Figure 8:
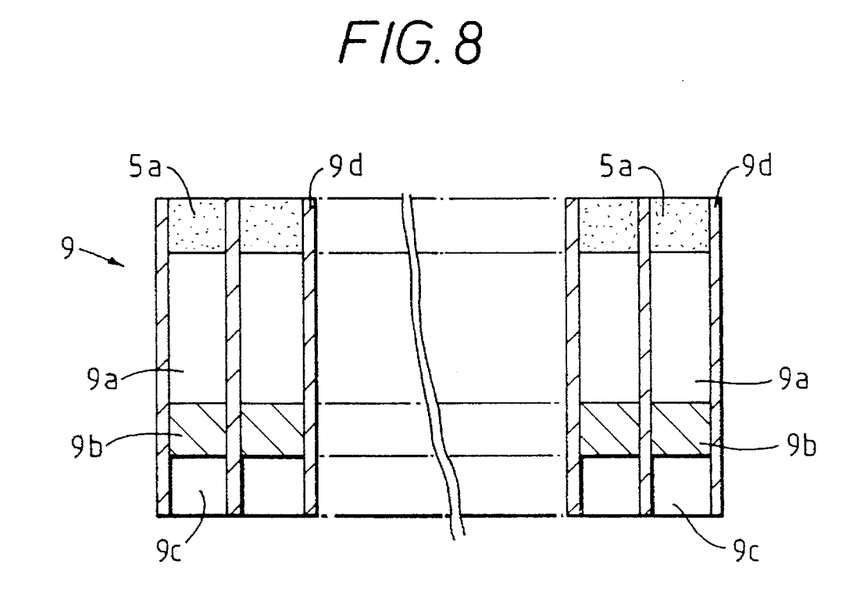

An embodiment of a camera 9 according to the present invention is illustrated in FIG. 7, and a cross-section taken along a line A—A' of FIG. 7 is shown in FIG. 8. The camera 9 has an array of fluorescent bodies 5a, glass fiber waveguides 9a, liquid crystal filters 9b, and a solid-state image pick-up device having an array of detector elements 9c. Integrated solid-state image detector elements 9c can be used, which are arrayed linearly and have a width of one or two pixels. Each waveguide 9a, together with its associated fluorescent element 5a, detector element 9c and filter 9b are separated by walls 9d. It is preferable that such walls are made of a material having a light and/or electron shielding effect. By way of example, aluminum with carbon deposition thereon may be used. The walls 9d effectively remove blurs in the image due to X-rays at the time of application of a high acceleration voltage due to charging-up at a low acceleration voltage, or due to light emission.

When the camera of FIGS. 7 and 8 is used in the arrangement of FIG. 3, good detection of the image of the sample can be achieved. Also, because the slit 8a allows a fine adjustment of the width thereof, adequate brightness and image information sufficient enough to satisfy an inherent resolution of the camera can be obtained. By detection of the electron beam image 4a with a camera unit 9 having a pixel partitioned fluorescent elements 5a, a liquid crystal filter 9b and a solid-state image pick-up device 9c, a brightness of each pixel can be detected as a voltage at a high precision. The filters 9b add a brightness correction function to the camera 9, so that, a high resolution image freed from irregular brightness and blurring even under a high acceleration voltage can be monitored by the monitor 14. Also recording of such an image becomes possible according to the invention.

A typical planar solid-state image device generally has about 400,000 pixels with a width of about 1 cm. However, such an imaging device has problems in practice because defective pixels and varied sensitivity levels between pixels are likely to be high due to the large number of pixels. Thus, the yield of satisfactory products is poor. When solid-state detector elements 9c in a linear array are used in the linear camera 9 of this embodiment of the invention, the production thereof becomes substantially easier. The number of pixels may be reduced to about 1/10 of the standard plate type. Thus, an improvement of more than 100 times can be be attained in its production yield. Therefore, the present invention offers significant advantage in terms of economy.

Figure 9:
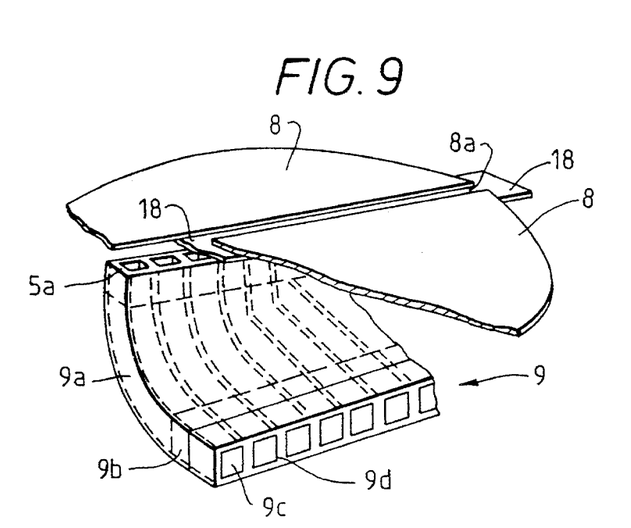
FIG. 9 shows a second embodiment of a camera which may be used in the electron microscope of FIG. 3.

FIG. 9 illustrates a second embodiment of a camera 9 which may be used in the electron microscope in FIG. 3. The camera of this embodiment is similar to that of FIGS. 7 and 8, and the same reference numerals are used to indicate corresponding parts. However, in the embodiment of FIG. 9, the waveguides 9a are curved about an axis parallel to the linear array of fluorescent elements 5a. Thus, as shown in FIG. 9, the camera 9 is located below the mask 8 so that the fluorescent elements 5a are aligned with, and directly below, the slit 8a. Thus, when the shutter 18 is moved clear of the slit 8a, electrons can pass through the slit 8a and reach the fluorescent elements 5a. However, because of the curvature of the waveguides 9a, the detector elements 9c are located to one side of the slit 8a, below the mask 8. Thus, electrons which pass through the slit 8a, and are moving generally perpendicular to the mask 8 as can be appreciated from FIG. 6(a) to 6(c), are moving in a path which does not intersect the detector elements 9(c).

Hence, the embodiment of FIG. 9 has the advantage that the detector elements 9(c) are protected from damage due to electrons. In the embodiment of FIGS. 7 and 8, the detector elements 9(c) will be located directly below the slit 8a, and therefore there is the possibility that electrons may travel through the fluorescent elements 5a and waveguides 9a, and reach the detector elements 9c.

Although the embodiment of FIGS. 7 and 8, and the embodiment of FIG. 9, use a camera 9 with both arranged in a linear array, it can readily be appreciated that it is possible for the detector elements 9c to have geometrical arrangement, provided they are connected by the waveguides 9a to the fluorescent elements 5a.

The fluorescent elements 5a are normally arranged in a linear array, so that they are aligned with the slit 8a. However, the present invention can also be applied to an arrangement of a planar type solid-state image camera 20 as shown in FIG. 10.

Figure 10:
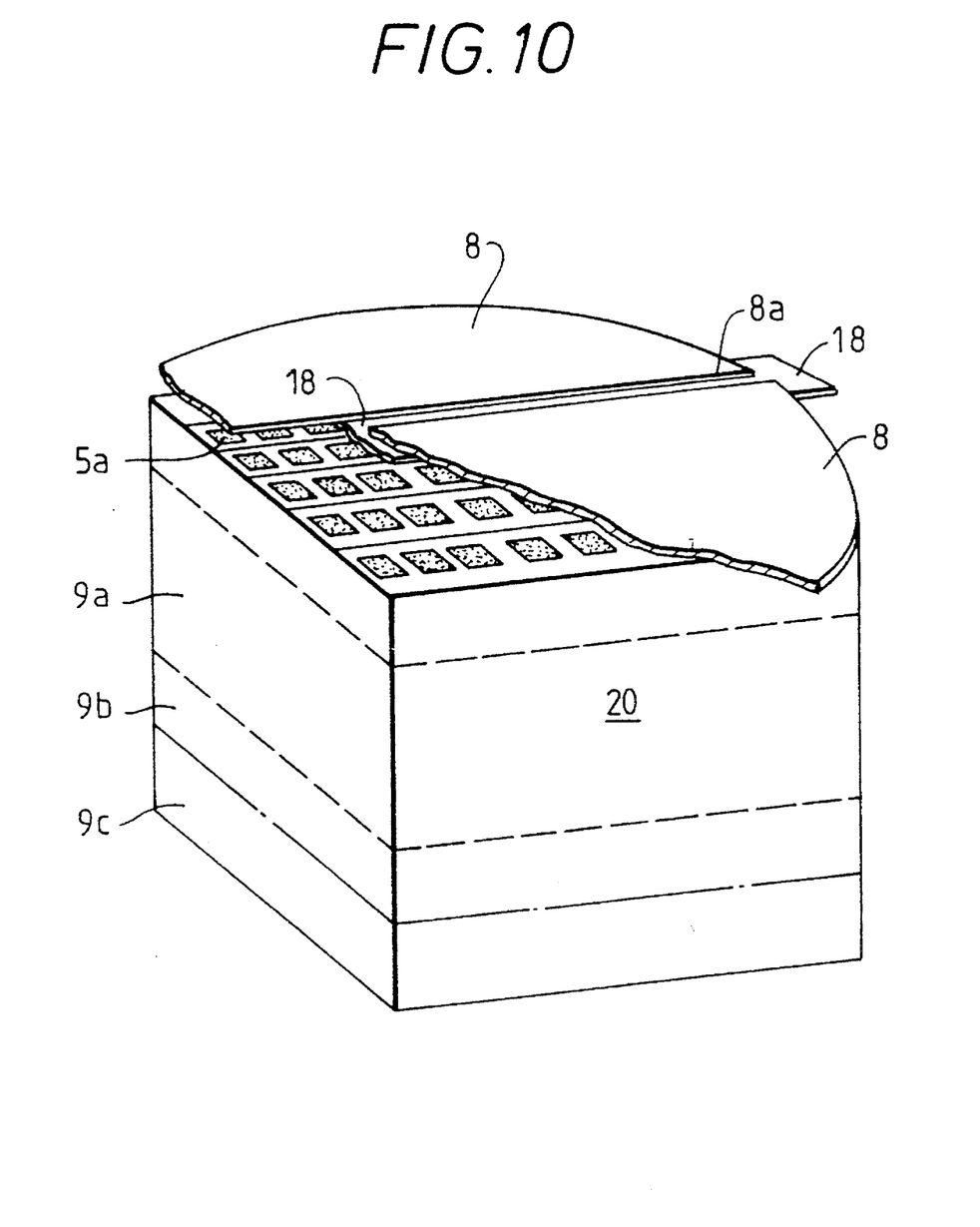
FIG. 10 shows a third embodiment of a camera which may be used in the electron microscope of FIG. 3.

In the embodiment shown in FIG. 10, fluorescent elements 5a are disposed in a plurality of columns on a surface plate, each of which is connected to a glass fiber waveguide 9a, a liquid crystal filter 9b and a solid-state image detector element 9c. Then, the mask 8 may be mounted so as to be movable. Then, at the time of image pick-up, the slit 8a is aligned with a particular column of the fluorescent elements 5a so as to allow a corresponding band of the electron beam image to be picked up. Scanning of the electron beam image is then achieved by the movement of the mask 8, with electrons reaching successive columns of the fluorescent elements 5a as the mask 8 moves.

It can be appreciated that the width of the slit 8a can be adjusted by suitable movement of the shutter 18. In the arrangements illustrated in FIGS. 6(a) to 6(c) it was assumed that the shutter was moved completely clear of the slit 8a. However, if the shutter 18 is moved only partially clear of that slit 8a, the effect is to vary the effective width of the slit.

Figure 6C:
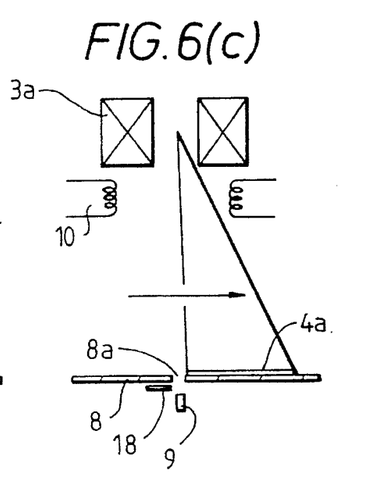

Alternatively, it may be possible to move part of the plate 8 (e.g. by providing suitable drive means 30 shown in FIG. 6(a) to 6(c) to vary the width of the slit 8a. If this arrangement is then used with the planar camera of FIG. 10, it becomes possible to vary the number of columns of fluorescent elements which receive electrons when the shutter 18 is moved.

A further advantage of the embodiment of FIG. 10 is that, if a particular column of fluorescent elements 5a is damaged or degraded, the camera can be operated using other columns of fluorescent elements.

According to the present invention, it becomes possible to eliminate or at least reduce blurring in images, thereby enabling high resolution image observation and recording free from irregular brightness distribution.

In addition by combining the camera with a slit and a shutter as described above a prolonged service life of the solid-state image camera can be further achieved.

Thus, with the present invention, it is possible for the first time according to the invention to carry out image observation and recording at a high or very high acceleration voltage. At the same time, the standard operations conventionally conducted in a dark room, such as image observation, film processing and the like, are eliminated. This gives the advantages of improved safety in handling chemicals and prevents environmental pollution as well.

What is claimed is:

1. An electron microscope, comprising:
   means for generating an electron beam;
   means for causing said electron beam to be incident on a sample and to pass therethrough, thereby to form an image beam;
   a camera; and
   means for focusing said image beam on said camera;
   wherein said camera has a plurality of fluorescent elements, with walls therebetween, for generating light in response to said image beam and a plurality of detector elements for detecting said light from respective ones of said plurality of fluorescent elements, wherein said plurality of fluorescent elements form a linear array, said electron microscope having a plurality of optical waveguides for directing light from each of said plurality of fluorescent elements to respective ones of said plurality of detector elements, and wherein each of said plurality of optical waveguides is curved about an axis parallel to said linear array.

2. An electron microscope, comprising:
   means for generating an electron beam;
   means for causing said electron beam to be incident on a sample and to pass therethrough, thereby to form an image beam;
   a camera; and
   means for focusing said image beam on said camera;
   wherein said camera has a plurality of fluorescent elements, with walls therebetween, for generating light in response to said image beam and a plurality of detector elements for detecting said light from respective ones of said plurality of fluorescent elements, and wherein said plurality of fluorescent elements form a linear array, said electron microscope having scanning means for causing said image beam to scan transversely to said linear array.

3. An electron microscope according to claim 2, wherein scanning means is a deflecting coil.

4. An electron microscope, comprising:
   means for generating an electron beam;
   means for causing said electron beam to be incident on a sample and to pass therethrough, thereby to form an image beam;
   a camera; and
   means for focusing said image beam on said camera;
   wherein said camera has a plurality of fluorescent elements, with walls therebetween, for generating light in response to said image beam and a plurality of detector elements for detecting said light from respective ones of said plurality of fluorescent elements, said electron microscope having a mask having an opening therein between said means for focusing said image beam and said camera.

5. An electron microscope according to claim 4, wherein said opening is an elongate slit.

6. An electron microscope according to claim 4, having a movable shutter for blocking said opening.

7. An electron microscope according to claim 4, wherein said plurality of detector elements are arranged to output respective detection signals and said electron microscope further includes memory means for storing said detection signals.

8. An electron microscope according to claim 7, also including a display means for displaying said detection signals.

9. An electron microscope according to claim 4, wherein said plurality of fluorescent elements form a linear array.

10. An electron microscope according to claim 9, having a plurality of optical waveguides for directing light from each of said plurality of fluorescent elements to respective ones of said plurality of detector elements.

11. An electron microscope according to claim 10, wherein each of said optical waveguides has an adjustable filter therein for controlling the amount of light transmitted between each fluorescent element and the corresponding detector element.

12. An electron microscope, comprising:

means for generating an electron beam;

means for causing said electron beam to be incident on a sample and to pass therethrough, thereby to form an image beam;

a linear detector for detecting said image beam;

means for focussing said image beam on said linear detector; and means for causing said image beam to scan transversely to said linear detector.

13. An electron microscope according to claim 12, wherein said linear detector comprises:

a plurality of fluorescent elements;

a corresponding plurality of detector elements; and a plurality of optical waveguides for directing light from each of said plurality of fluorescent elements to respective ones of said plurality of detector elements.

14. An electron microscope according to claim 13, wherein each of said optical waveguides has an adjustable filter therein for controlling the amount of light transmitted between each fluorescent element and the corresponding detector element.

15. A camera comprising:

a plurality of fluorescent elements;

a corresponding plurality of detector elements; and a plurality of optical waveguides for directing light from each of said plurality of fluorescent elements to respective ones of said plurality of detector elements;

wherein each of said optical waveguides has an adjustable filter therein for controlling the amount of light transmitted between each fluorescent element and the corresponding detector element, wherein said plurality of fluorescent elements form a linear array, and wherein each of said plurality of optical waveguides is curved about an axis parallel to said linear array.

16. A camera according to claim 15, wherein each of said filters is a liquid crystal element.

17. A camera according to claim 15, wherein said detector elements are in the form of a solid state array.

18. A method of operating an electron microscope, comprising:

generating an electron beam;

causing said electron beam to be incident on a sample, and to pass therethrough, thereby forming an image beam;

focusing said image beam; and causing said focussed image beam to scan transversely across a linear detector.

19. A method according to claim 18, further including generating time-divided outputs from said linear detector in dependence on said scan of said linear detector.

20. A method according to claim 19, further including storing said time-divided outputs.

* * * * *